(12) United States Patent
Castro et al.

(10) Patent No.: US 10,803,939 B2
(45) Date of Patent: Oct. 13, 2020

(54) TECHNIQUES FOR PROGRAMMING A MEMORY CELL

(71) Applicant: Micron Technology, Inc., Boise, ID (US)

(72) Inventors: Hernan A. Castro, Shingle Springs, CA (US); Innocenzo Tortorelli, Cernusco sul Naviglio (IT); Agostino Pirovano, Milan (IT); Fabio Pellizzer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 21 days.

(21) Appl. No.: 16/108,784

(22) Filed: Aug. 22, 2018

(65) Prior Publication Data
US 2020/0066343 A1 Feb. 27, 2020

(51) Int. Cl.
*G11C 13/00* (2006.01)
*G11C 5/06* (2006.01)

(52) U.S. Cl.
CPC .......... *G11C 13/0069* (2013.01); *G11C 5/063* (2013.01); *G11C 13/004* (2013.01); *G11C 13/0007* (2013.01); *G11C 13/0064* (2013.01); *G11C 2013/009* (2013.01); *G11C 2013/0073* (2013.01)

(58) Field of Classification Search
CPC .......................... G11C 14/0045; G11C 14/009
USPC ................................................. 365/148, 163
See application file for complete search history.

(56) References Cited

U.S. PATENT DOCUMENTS

| | | | |
|---|---|---|---|
| 9,312,005 | B2 | 4/2016 | Castro |
| 9,324,423 | B2 | 4/2016 | Castro |
| 2005/0226034 | A1 | 10/2005 | Perner |
| 2011/0019495 | A1 | 1/2011 | Scheuerlein et al. |
| 2015/0294716 | A1* | 10/2015 | Tortorelli ............. G11C 13/004 365/163 |
| 2015/0325289 | A1 | 11/2015 | Castro |
| 2017/0125097 | A1 | 5/2017 | Tortorelli |

(Continued)

FOREIGN PATENT DOCUMENTS

| | | |
|---|---|---|
| KR | 20100117121 A | 11/2010 |
| TW | I541811 B | 7/2016 |

OTHER PUBLICATIONS

Ielmini et al., "Recovery and Drift Dynamics of Resistance and Threshold Voltages in Phase-Change Memories", IEEE Transactions on Electron Devices, Feb. 2007, pp. 308-315, vol. 54, Issue 2, IEEE.

(Continued)

*Primary Examiner* — Han Yang
(74) *Attorney, Agent, or Firm* — Holland & Hart LLP

(57) ABSTRACT

Techniques are provided for programming a self-selecting memory cell that stores a first logic state. To program the memory cell, a pulse having a first polarity may be applied to the cell, which may result in the memory cell having a reduced threshold voltage. During a duration in which the threshold voltage of the memory cell may be reduced (e.g., during a selection time), a second pulse having a second polarity (e.g., a different polarity) may be applied to the memory cell. Applying the second pulse to the memory cell may result in the memory cell storing a second logic state different than the first logic state.

18 Claims, 8 Drawing Sheets

(56) References Cited

U.S. PATENT DOCUMENTS

2017/0236580 A1\* 8/2017 Chu .................. G11C 13/0064
                                                      365/163
2017/0262171 A1\* 9/2017 Cheon .................. G06F 3/0688

OTHER PUBLICATIONS

Kostylev, "Recovery and other effects of annihilation of high current density filaments after switching in chalcogenide alloys", Non-Volatile Memory Technology symposium, Nov. 11-14, 2008, pp. 1-7, IEEE.

ISA/KR, International Search Report and Written Opinion of the International Searching Authority, Int'l Appl. No. PCT/US2019/ 045944, dated Dec. 2, 2019, Korean Intellectual Property Office, Seo-gu, Daejeon, Republic of Korea, 15 pgs.

Taiwanese Intellectual Property Office, "Office Action," issued in connection with Taiwan Application No. 106108062, dated Apr. 14, 2020, 17 pages with translation.

\* cited by examiner

TECHNIQUES FOR PROGRAMMING A MEMORY CELL

BACKGROUND

The following relates generally to operating a memory array and more specifically to programming a self-selecting memory device.

Memory devices are widely used to store information in various electronic devices such as computers, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory cells may maintain their stored logic state for extended periods of time even in the absence of an external power source. Volatile memory cells may lose their stored state over time unless they are periodically refreshed by an external power source.

Improving memory devices, generally, may include increasing memory cell density, increasing read/write speeds, increasing reliability, increasing data retention, reducing power consumption, or reducing manufacturing costs, among other metrics. Programming a memory cell using a reduced write voltage may be desired to reduce stress on the memory cell and decrease overall power usage of the memory array.

DETAILED DESCRIPTION

Figure 1:
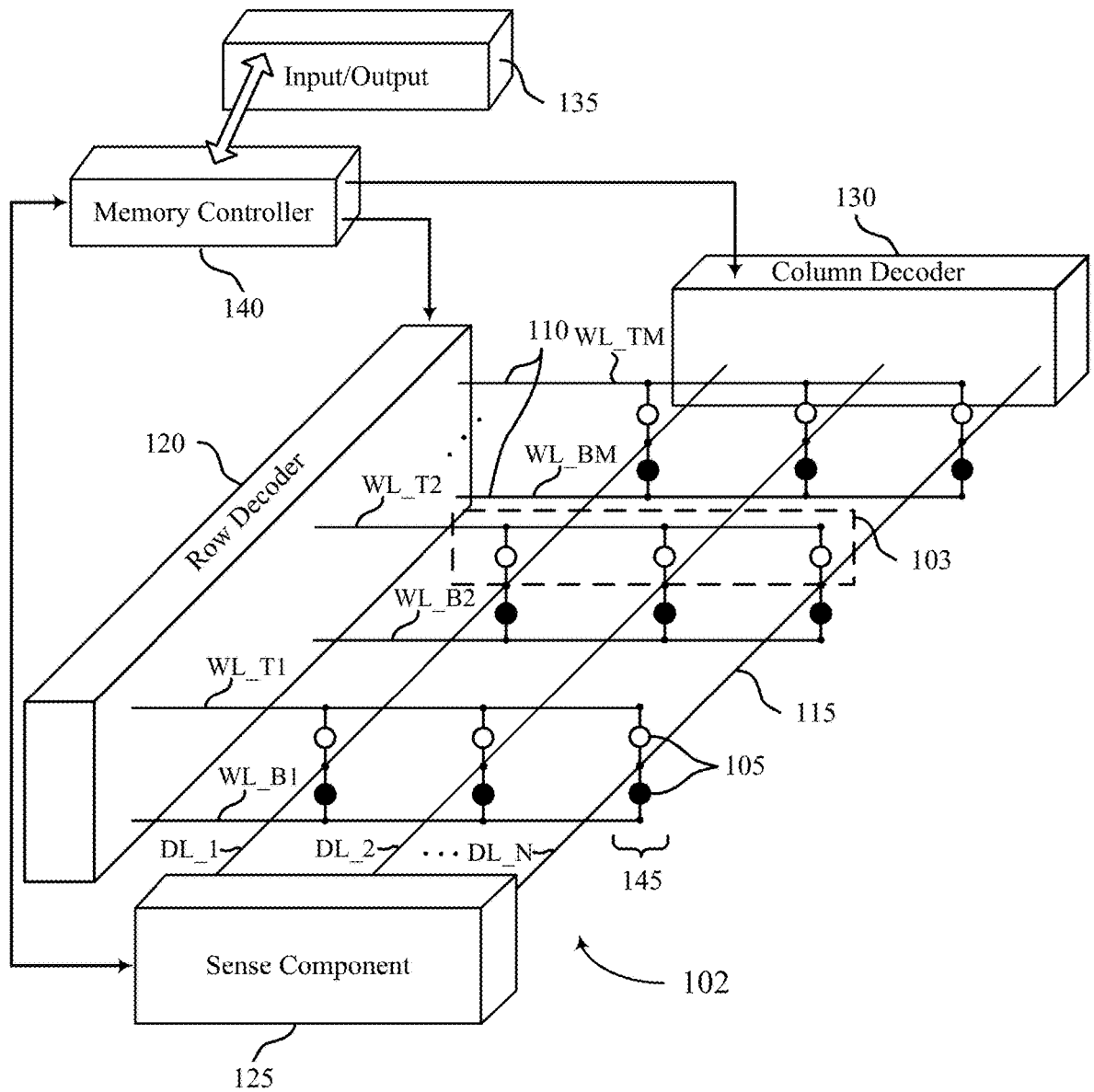
FIG. 1 illustrates an example memory device in accordance with examples of the present disclosure.

A self-selecting memory cell including a chalcogenide alloy may be programmed to store one or more bits of data by using various programming pulses. As such, a single self-selecting memory cell may be configured to store more than one bit of digital data. In some cases, a self-selecting memory cell may be selected by applying a certain bias between a word line and a digit line. The logic state that is stored in a self-selecting memory cell may be based on a polarity of a programming pulse applied to the self-selecting memory cell. For example, a self-selecting memory may store a logic '0' upon application of a programming pulse having a first polarity and the self-selecting memory may store a logic '1' upon application of a programming pulse having a second, different polarity. Further, the threshold voltages representative of a logic state (e.g., a logic "0") detected by a sense component may vary based on the polarity of the read pulse applied during a read operation. For example, the threshold voltages may appear different when applying different polarities of read pulses due to the asymmetrical distribution of ions in a programmed self-selecting memory cell.

Techniques are provided for programming a self-selecting memory cell (e.g., that may include a chalcogenide material) by detecting the occurrence of a snap-back event. To program (e.g., to write) a self-selecting memory storing a first logic state (e.g., a logic "1"), a programming pulse sequence that includes two pulses may be used. A first pulse of the programming pulse sequence may have a first polarity and the second pulse of the programming pulse sequence may have a second polarity different than the first polarity. Depending on the logic state stored in the self-selecting memory cell, the self-selecting memory cell may experience a snap-back event as a result of the first pulse being applied to the cell. A snapback event may be characterized by an increase (e.g., sudden increase) in a conductance of the memory cell. After a duration, the memory cell may return to its original conductance. After the memory cell returns to its original conductance, the memory cell may experience a temporary reduction of its threshold voltage.

Upon detecting the snapback event, the second pulse may be applied to program a second logic state (e.g., a logic "0") to the memory cell. Because the threshold voltage of the memory cell may be temporarily reduced, the second pulse may comprise a lesser magnitude to program the second logic state. Stated another way, when a threshold voltage of the memory cell is reduced, a lower voltage is needed to write a second logic state to the memory cell (e.g., as opposed to a threshold voltage of the memory cell not being reduced). Thus, by applying a second voltage to a self-selecting memory cell during a snapback event (e.g., during a duration that the threshold voltage of the memory cell is reduced), a logic state may be written to the memory cell using a reduced voltage, which may reduce stress of the memory cell and decrease overall power consumption of the memory array. In some cases, the duration of the snapback event may be less than 1 nanosecond. If no snap-back event is detected, the self-selecting memory cell may already store the value attempting to be written to the self-selecting memory cell by the write operation, and the second pulse may not be applied to the memory cell.

In some examples, a first pulse may be applied to a memory cell storing a first logic state. As described above, the application of the first pulse may result in a snapback event associated with the memory cell. The snapback event may then be detected (e.g., by a memory controller), and a second pulse may be applied to the memory cell based on or in response to the snapback event being detected. In some examples, the second pulse may have a second polarity (e.g., an opposite polarity) different than the first polarity. Based on the application of the second pulse, a second logic state (e.g., a different logic state) may be stored in the memory cell.

In another example, a first pulse may be applied to a memory cell during a write operation. The memory cell may, in some examples, store a first logic state. The first logic state (e.g., a logic "1") may be detected (e.g., by a memory controller) in response to applying the first pulse to the memory cell. After detecting the first logic state, a second pulse may be applied to the memory cell. In some examples, the second pulse may have a second polarity (e.g., an opposite polarity) different than the first polarity. Based on the application of the second pulse, a second logic state (e.g., a different logic state) may be stored in the memory cell.

In some examples, a threshold voltage of a memory cell may be reduced for a duration during a write operation. In some examples, the threshold voltage may be reduced based on a first pulse being applied to the memory cell. The first pulse may, for example, have a first polarity and the memory cell may store a first logic value. During the duration in which the threshold voltage of the memory cell is reduced, a second pulse may be applied to the memory cell. In some examples, the second pulse may have a different polarity than the first pulse. Based on the application of the second pulse, a second logic state (e.g., a different logic state) may be stored in the memory cell.

Features of the disclosure introduced above are further described below in the context of memory array. Specific examples are then described for operating the memory array related to techniques to program a self-selecting memory device in some examples. These and other features of the disclosure are further illustrated by and described with reference to apparatus diagrams, system diagrams, and flowcharts that relate to techniques for programming a self-selecting memory device.

FIG. 1 illustrates an example memory device 100 in accordance with examples of the present disclosure. Memory device 100 may also be referred to as an electronic memory apparatus. FIG. 1 is an illustrative representation of various components and features of the memory device 100. As such, it should be appreciated that the components and features of the memory device 100 shown to illustrate functional interrelationships, not their actual physical positions within the memory device 100. In the illustrative example of FIG. 1, the memory device 100 includes a three-dimensional (3D) memory array 102. The 3D memory array 102 includes memory cells 105 that may be programmable to store different states. In some examples, each memory cell 105 may be programmable to store two states, denoted as a logic 0 and a logic 1. In some examples, a memory cell 105 may be configured to store more than two logic states. A memory cell 105 may, in some examples, include a self-selecting memory cell. Although some elements included in FIG. 1 are labeled with a numeric indicator, other corresponding elements are not labeled, though they are the same or would be understood to be similar, in an effort to increase visibility and clarity of the depicted features.

The 3D memory array 102 may include two or more two-dimensional (2D) memory arrays 103 formed on top of one another. This may increase a number of memory cells that may be placed or created on a single die or substrate as compared with 2D arrays, which in turn may reduce production costs, or increase the performance of the memory device, or both. The memory array 102 may include two levels of memory cells 105 and may thus be considered a 3D memory array; however, the number of levels is not limited to two. Each level may be aligned or positioned so that memory cells 105 may be aligned (exactly, overlapping, or approximately) with one another across each level, forming a memory cell stack 145. In some cases, the memory cell stack 145 may include multiple self-selecting memory cells laid on top of another while sharing an access line for both as explained below. In some cases, the self-selecting memory cells may be multi-level self-selecting memory cells configured to store more than one bit of data using multi-level storage techniques.

In some examples, each row of memory cells 105 is connected to an access line 110, and each column of memory cells 105 is connected to a bit line 115. Access lines 110 and bit lines 115 may be substantially perpendicular to one another and may create an array of memory cells. As shown in FIG. 1, the two memory cells 105 in a memory cell stack 145 may share a common conductive line such as a bit line 115. That is, a bit line 115 may be in electronic communication with the bottom electrode of the upper memory cell 105 and the top electrode of the lower memory cell 105. Other configurations may be possible, for example, a third layer may share an access line 110 with a lower layer. In general, one memory cell 105 may be located at the intersection of two conductive lines such as an access line 110 and a bit line 115. This intersection may be referred to as a memory cell's address. A target memory cell 105 may be a memory cell 105 located at the intersection of an energized access line 110 and bit line 115; that is, access line 110 and bit line 115 may be energized to read or write a memory cell 105 at their intersection. Other memory cells 105 that are in electronic communication with (e.g., connected to) the same access line 110 or bit line 115 may be referred to as untargeted memory cells 105.

As discussed above, electrodes may be coupled to a memory cell 105 and an access line 110 or a bit line 115. The term electrode may refer to an electrical conductor, and in some cases, may be employed as an electrical contact to a memory cell 105. An electrode may include a trace, wire, conductive line, conductive layer, or the like that provides a conductive path between elements or components of memory device 100. In some examples, a memory cell 105 may include a chalcogenide material positioned between a first electrode and a second electrode. One side of the first electrode may be coupled to an access line 110 and the other side of the first electrode to the chalcogenide material. In addition, one side of the second electrode may be coupled to a bit line 115 and the other side of the second electrode to the chalcogenide material. The first electrode and the second electrode may be the same material (e.g., carbon) or different.

Operations such as reading and writing may be performed on memory cells 105 by activating or selecting access line 110 and bit line 115. In some examples, access lines 110 may also be known as word lines 110, and bit lines 115 may also be known digit lines 115. References to access lines, word lines, and bit lines, or their analogues, are interchangeable without loss of understanding or operation. Activating or selecting a word line 110 or a bit line 115 may include applying a voltage to the respective line. Word lines 110 and bit lines 115 may be made of conductive materials such as metals (e.g., copper (Cu), aluminum (Al), gold (Au), tungsten (W), titanium (Ti)), metal alloys, carbon, conductively-doped semiconductors, or other conductive materials, alloys, compounds, or the like.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 may receive a column address from the memory controller 140 and activate the appropriate bit line 115. For example, memory array 102 may include multiple word lines 110, labeled WL_1 through WL_M, and multiple digit lines 115, labeled DL_1 through DL_N, where M and N depend on the array size. Thus, by activating a word line 110 and a bit line 115, e.g., WL_2 and DL_3, the memory cell 105 at their intersection may be accessed.

Upon accessing, a memory cell 105 may be read, or sensed, by sense component 125 to determine the stored state of the memory cell 105. For example, a voltage may be applied to a memory cell 105 (using the corresponding word line 110 and bit line 115) and the presence of a resulting current may depend on the applied voltage and the threshold voltage of the memory cell 105. In some cases, more than one voltage may be applied. Additionally, if an applied voltage does not result in current flow, other voltages may be applied until a current is detected by sense component 125. By assessing the voltage that resulted in current flow, the stored logic state of the memory cell 105 may be determined. In some cases, the voltage may be ramped up in magnitude until a current flow is detected. In other cases, predetermined voltages may be applied sequentially until a current is detected. Likewise, a current may be applied to a memory cell 105 and the magnitude of the voltage to create the current may depend on the electrical resistance or the threshold voltage of the memory cell 105.

In some examples, a memory cell may be programmed by providing an electric pulse to the cell, which may include a memory storage element. The pulse may be provided via a first access line (e.g., word line 110) or a second access line (e.g., bit line 115), or a combination thereof. In some cases, upon providing the pulse, ions may migrate within the memory storage element, depending on the polarity of the memory cell 105. Thus, a concentration of ions relative to the first side or the second side of the memory storage element may be based at least in part on a polarity of a voltage between the first access line and the second access line. In some cases, asymmetrically shaped memory storage elements may cause ions to be more crowded at portions of an element having more area. Certain portions of the memory storage element may have a higher resistivity and thus may give rise to a higher threshold voltage than other portions of the memory storage element. This description of ion migration represents an example of a mechanism of the self-selecting memory cell for achieving the results described herein. This example of a mechanism should not be considered limiting. This disclosure also includes other examples of mechanisms of the self-selecting memory cell for achieving the results described herein.

Sense component 125 may include various transistors or amplifiers to detect and amplify a difference in the signals, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120. An ordinary person skilled in the art would appreciate that sense component may be associated either with column decoder or row decoder without losing its functional purposes.

A memory cell 105 may be set or written by similarly activating the relevant word line 110 and bit line 115 and at least one logic value may be stored in the memory cell 105. Column decoder 130 or row decoder 120 may accept data, for example input/output 135, to be written to the memory cells 105. In the case of a self-selecting memory cell including a chalcogenide material, a memory cell 105 may be written to store data by applying a programming sequence including a first pulse having a first polarity and a second pulse having a second polarity. The programming pulse may have various shapes. This process is discussed in more detail below with reference to FIGS. 3 and 4.

The memory controller 140 may control the operation (e.g., read, write, re-write, refresh, discharge) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals to activate the desired word line 110 and bit line 115. Memory controller 140 may also generate and control various voltages or currents used during the operation of memory device 100.

The memory controller 140 may be configured to execute a write operation that can program a self-selecting memory cell. For example, the memory controller 140 may be configured to apply, during a write operation, a first pulse having a first polarity to the memory cell 105. In some examples, applying the first pulse having the first polarity may include applying a first voltage to the first access line (e.g., to word line 110) and a second voltage to the second access line (e.g., bit line 115). Applying the second pulse having the second polarity may include applying a third voltage to the first access line (e.g., to bit line 115) and fourth voltage to the second access line (e.g., bit line 115). The memory controller 140 may be configured to detect a snapback event at the memory cell 105 in response to applying the first pulse. The snapback event may, for example, result in a reduced threshold voltage of the memory cell 105.

In some examples, the memory controller 140 may apply a second pulse having a second polarity different than the first polarity to the memory cell 105 in response to detecting the snapback event and, subsequently, may store a second logic state different than the first logic state in the memory cell 105 based at least in part on applying the second pulse to the memory cell. Stated another way, a threshold voltage of the memory cell 105 may be reduced after applying the first pulse (e.g., during a snapback event) and applying the second pulse when the threshold voltage is reduced may store (e.g., write) a second logic state to the memory cell 105.

In some examples, the memory controller 140 may be configured to apply, during a write operation, a first pulse having a first polarity to the memory cell 105. In some examples, the memory controller 140 may detect the first logic state stored by the memory cell in response to applying the first pulse to the memory cell. As described above, the first logic state may be detected during a snapback event. In some examples, the memory controller 140 may then store a second logic state in the memory cell 105 by applying a second pulse having a second polarity during the write operation based at least in part detecting the first logic state. The second logic state may be different than the first logic state.

Figure 2:
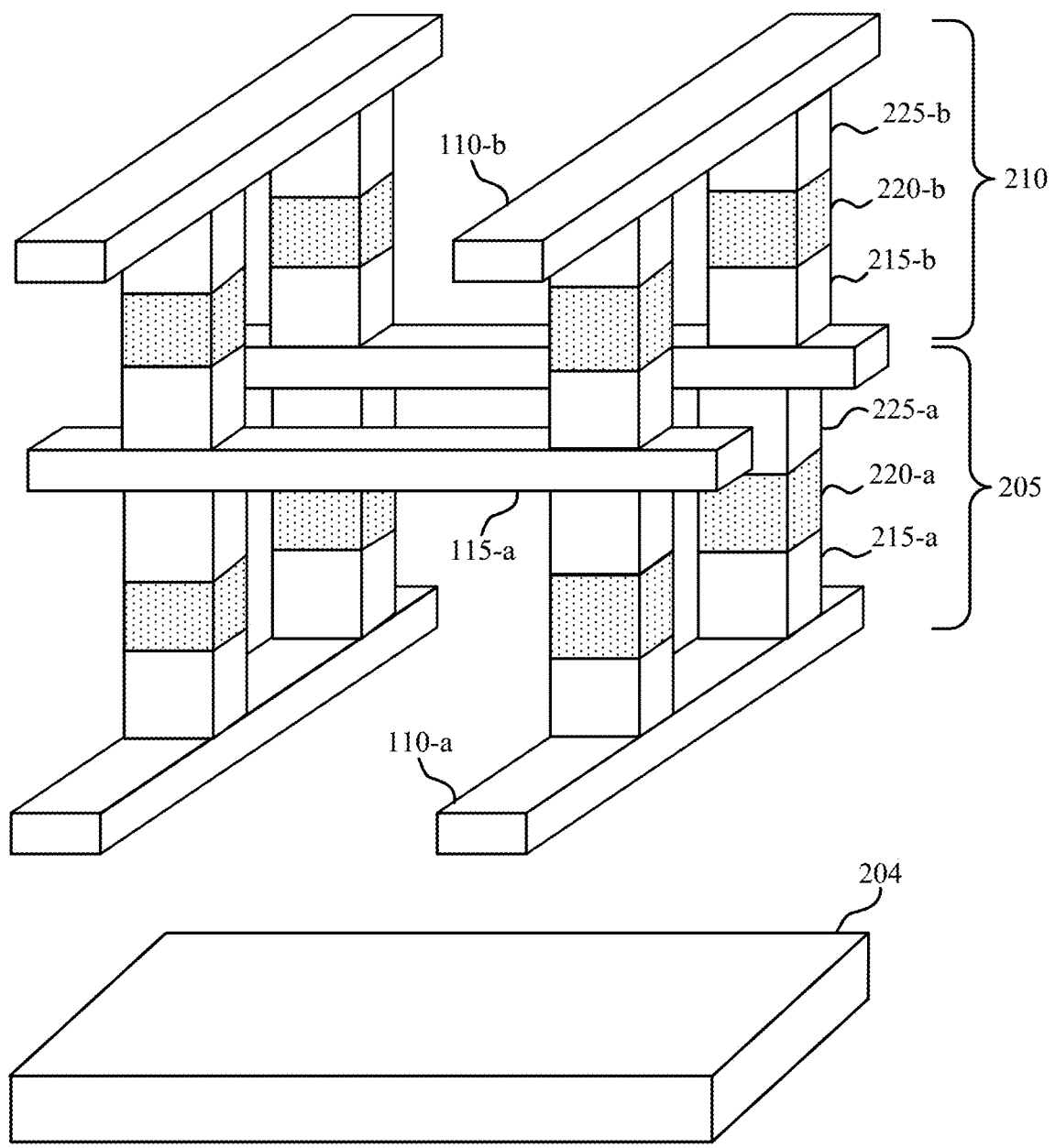
FIG. 2 illustrates an example of a memory array that supports techniques for programming a self-selecting memory device in accordance with aspects of the present disclosure.

FIG. 2 illustrates an example of a 3D memory array 200 that supports techniques for programming a self-selecting memory device in accordance with aspects of the present disclosure. Memory array 200 may be an example of portions of memory array 102 described with reference to FIG. 1. Memory array 200 may include a first array or deck 205 of memory cells that is positioned above a substrate 204 and second array or deck 210 of memory cells on top of the first array or deck 205. Memory array 200 may also include word line 110-a and word line 110-b, and bit line 115-a, which may be examples of word line 110 and bit line 115, as described with reference to FIG. 1. Memory cells of the first deck 205 and the second deck 210 each may have one or more self-selecting memory cell (e.g., self-selecting memory cell 220-a and self-selecting memory cell 220-b, respectively). Although some elements included in FIG. 2 are labeled with a numeric indicator, other corresponding elements are not labeled, though they are the same or would be understood to be similar, in an effort to increase visibility and clarity of the depicted features.

Self-selecting memory cells of the first deck 205 may include first electrode 215-a, chalcogenide material 220-a, and second electrode 225-a. In addition, self-selecting memory cells of the second deck 210 may include a first electrode 215-b, chalcogenide material 220-b, and second electrode 225-b. The self-selecting memory cells of the first deck 205 and second deck 210 may, in some examples, have common conductive lines such that corresponding self-selecting memory cells of each deck 205 and 210 may share bit lines 115 or word lines 110 as described with reference to FIG. 1. For example, first electrode 215-b of the second deck 210 and the second electrode 225-a of the first deck 205 may be coupled to bit line 115-a such that bit line 115-a is shared by vertically adjacent self-selecting memory cells.

The architecture of memory array 200 may be referred to as a cross-point architecture, in some cases, in which a memory cell is formed at a topological cross-point between a word line and a bit line as illustrated in FIG. 2. Such a cross-point architecture may offer relatively high-density data storage with lower production costs compared to other memory architectures. For example, the cross-point architecture may have memory cells with a reduced area and, resultantly, an increased memory cell density compared to other architectures. For example, the architecture may have a 4F2 memory cell area, where F is the smallest feature size, compared to other architectures with a 6F2 memory cell area, such as those with a three-terminal selection component. For example, DRAM may use a transistor, which is a three-terminal device, as the selection component for each memory cell and may have a larger memory cell area compared to the cross-point architecture.

While the example of FIG. 2 shows two memory decks, other configurations are possible. In some examples, a single memory deck of self-selecting memory cells may be constructed above a substrate 204, which may be referred to as a two-dimensional memory. In some examples, a three or four memory decks of memory cells may be configured in a similar manner in a three-dimensional cross point architecture.

In some examples, one or more of the memory decks may include a self-selecting memory cell 220 that includes chalcogenide material. The self-selecting memory cell 220 may, for example, include a chalcogenide glass such as, for example, an alloy of selenium (Se), tellurium (Te), arsenic (As), antimony (Sb), carbon (C), germanium (Ge), and silicon (Si). In some example, a chalcogenide material having primarily selenium (Se), arsenic (As), and germanium (Ge) may be referred to as SAG-alloy. In some examples, SAG-alloy may include silicon (Si) and such chalcogenide material may be referred to as SiSAG-alloy. In some examples, the chalcogenide glass may include additional elements such as hydrogen (H), oxygen (O), nitrogen (N), chlorine (Cl), or fluorine (F), each in atomic or molecular forms.

In some examples, a self-selecting memory cell 220 including chalcogenide material may be programmed to a logic state by applying a first pulse having a first polarity. By way of example, when a particular self-selecting memory cell 220 is programmed, elements within the cell separate, causing ion migration. Ions may migrate towards a particular electrode, depending on the polarity of the pulse applied to the memory cell. For example, in a self-selecting memory cell 220, ions may migrate towards the negative electrode. The memory cell may then be read by applying a voltage across the cell to sense. The threshold voltage seen during a read operation may be based on the distribution of ions in the memory cell and the polarity of the read pulse. For example, if a memory cell has a given distribution of ions, the threshold voltage detected during the read operation may be different for a first read pulse with a first polarity than it is with a second read pulse having a second polarity. Depending on the polarity of the memory cell, this concentration of migrating ions may represent a logic "1" or logic "0" state. This description of ion migration represents an example of a mechanism of the self-selecting memory cell for achieving the results described herein. This example of a mechanism should not be considered limiting. This disclosure also includes other examples of mechanisms of the self-selecting memory cell for achieving the results described herein.

Before programming, the self-selecting memory cell 220 may have stored a first logic state (e.g., a logic "1"). The first pulse may be applied to, for example, word line 110-b. Upon applying the first pulse, a snapback event at the self-selecting memory cell 220 may be detected in response to applying the first pulse. As described above, a snapback event may be characterized by a reduced threshold voltage of the self-selecting memory cell 220. For example, as part of a snapback event the memory cell may experience an increase (e.g., sudden increase) in a conductance of the memory cell. After a duration, the memory cell may return to its original conductance. After the memory cell returns to its original conductance, the memory cell may then experience a temporary reduction of its threshold voltage. This reduction of the threshold may be detectable using pulses having a positive polarity or a negative polarity. Thus, applying the first pulse may reduce a threshold voltage of the self-selecting memory cell 220 (e.g., for a duration). In some examples, the snapback event may be detected by a memory controller (e.g., by memory controller 140 as described above with reference to FIG. 1). After detecting the snapback event, a second pulse having a second polarity different than the first polarity may be applied to the self-selecting memory cell 220. In some examples, the second pulse may be applied to bit line 115-b. Once the second pulse with a second polarity (e.g., a different polarity) is applied a second logic state (e.g., a logic "0") may be stored in the self-selecting memory cell 220.

Figure 3:
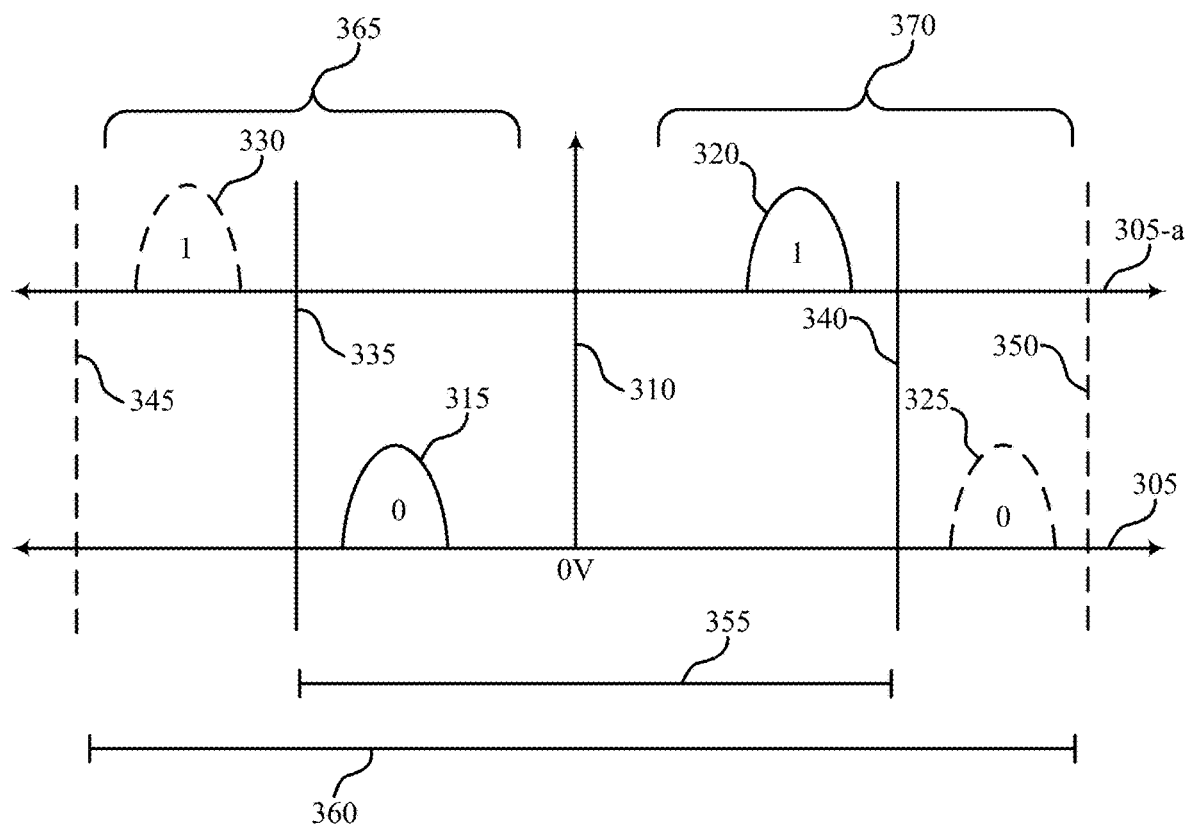
FIG. 3 illustrates an example of a diagram showing distributions of threshold voltages of a self-selecting memory cell that supports techniques for programming a self-selecting memory device in accordance with aspects of the present disclosure.

FIG. 3 illustrates an example of a diagram 300 showing distributions of threshold voltages of a self-selecting memory cell in accordance with examples of the present disclosure. A self-selecting memory cell may be configured to store a particular logic state based on one or more pulses applied to the cell. The voltage distributions depict logic states that may be stored in a self-selecting memory cell.

Self-selecting memory cells may include a chalcogenide material as described with reference to FIGS. 1 and 2. The threshold voltage distributions may represent a programming scheme for writing a logic state to the cell. The x-axes 305 and 305-a may represent a voltage values for threshold voltage distributions of a memory cell (e.g., memory cell 105 as described with reference to FIG. 1). The y-axis 310 may represent a likelihood that a threshold voltage may occur in the memory cell. Additionally or alternatively, FIG. 3 may include threshold voltage distribution 315 that represents a first logic state and a threshold voltage distribution 320 that represents a second (e.g., a different) logic state. In some examples, FIG. 3 may include threshold voltage distribution 325 that represents a first logic state and threshold voltage distribution that represents a second (e.g., a different) logic state. In some examples, FIG. 3 may include voltage levels 335, 340, 345, and 350 which may represent various voltage levels needed to access (e.g., write or read) a particular logic state to the memory cell.

In some examples, a write operation 360 may be illustrated. In a first write operation 360, a self-selecting memory cell may be written using programming pulse having a first polarity and a first magnitude. The programming pulse may be configured to store a specific logic state (e.g., a logic "0") in the memory cell. For example, the programming pulse may have the voltage level 345 when storing a logic "0" in the memory cell. After applying the voltage 350, the memory component of the memory cell may have an asymmetric distribution of a material (e.g., ions) that is configured to store the logic state. Due to the asymmetric distribution, the threshold voltage observed by a sense component for a specific logic state may be different based on the polarity of the read pulse applied to the memory cell. For example, if a first read pulse having a first polarity is applied to the memory cell, the memory cell may exhibit threshold voltage distributions indicated by the group 365. In another example, if a second read pulse having a second polarity is applied to the memory cell, the memory cell may exhibit threshold voltage distributions indicated by the group 370.

For example, before write operation 360 occurs the memory cell may store logic state (e.g., a logic "1"). Due to the write operation 360, a logic state (e.g., a logic "0") may be written to the memory cell. The memory cell may include a threshold voltage distribution for each logic state (e.g., threshold voltage distributions 320 or 330 for a logic "1"). To write the desired logic state to the memory cell, a particular voltage may be applied to the memory cell to overcome the threshold voltage of the memory cell. As shown in FIG. 3, a voltage 350 may be used to write a logic "1" to the memory cell in some write operations. Accordingly, the voltage 350 (e.g., VWRT1) may be applied to the memory cell to store a logic "1" in the memory cell for a duration. Because voltage 350 is a higher voltage (e.g., relative to voltage 340), the memory cell may ultimately endure higher stress and the memory array (e.g., memory array 102 as described with reference to FIG. 1) associated with the memory cell may consume less power.

In some examples, a write operation 355 may be illustrated. The write operation 355 may reduce stress on a memory cell and may result in the memory array associated with the memory cell consuming less power (e.g., relative to write operation 360). In the write operation 355, a desired logic state may be written to a memory cell that already stores a current logic state. For example, the current logic state of the memory cell may be a logic "1," as represented by threshold voltage distributions 320 or 330, and the desired logic state may be a logic "0," as represented by threshold voltage distributions 315 or 325. To write the desired logic state (e.g., a logic "0") to the memory cell, a first pulse having a first polarity and a first magnitude (e.g., voltage 340) may be applied to the memory cell. As described above, the memory cell may include a particular threshold voltage distribution. By applying the first pulse to the memory cell, a snapback event may occur. The snapback event may be characterized by a reduction in the threshold voltage distribution associated with logic state. Stated another way, by applying the first pulse to the memory cell, the threshold voltage distribution associated with logic state may shift (e.g., towards 0V). When the snap event occurs, the distributions 315, 320, 325, or 330 may shift closer to the y-axis 310 for a duration. After the sudden movement into the y-axis 310, the distributions 315, 320, 325, and 330 may relax back out to their original positions. The write operation 355 may be configured to write a cell of the opposite polarity before at least one of the distributions 315, 320, 325, 330 fully recover to their original positions.

The occurrence of the snapback that results from applying the voltage 340 may indicate that a logic "1" as represented by threshold voltage distribution 320 is stored in the memory cell. Rather than applying a programming pulse of a greater magnitude to write a logic "0," the memory controller may reverse the polarity of the programming pulse (e.g., the memory controller may apply a programming pulse having an opposite polarity of a pulse associated with the state stored on the memory cell). Thereby taking advantage of the asymmetrical properties of a programming self-selecting memory cell. Such features may reduce the power consumed during the write operation 355 as compared to the write operation 360.

Because the snapback event results in a reduced voltage distribution of the memory cell, a lower voltage may be used to write a logic state to the memory cell (e.g., relative to write operation 360). Thus, in some examples, a voltage greater than the threshold distribution of the memory cell may be applied to write logic state to the memory cell. Using a lower voltage may ultimately reduce stress on the memory cell and reduce the power consumption of the memory array (e.g., memory array 102 as described with reference to FIG. 1) associated with the memory cell.

In some examples, an alternative write operation 355 may be illustrated. The write operation 355 may reduce stress on a memory cell and may result in the memory array associated with the memory cell consuming less power (e.g., relative to write operation 360). In the alternative write operation 355, a desired logic state may be written to a memory cell that already stores a current logic state. For example, the current logic state of the memory cell may be a logic "0," as represented by threshold voltage distributions 315 or 325, and the desired logic state may be a logic "1" as represented by threshold voltage distributions 320 or 330.

To write the desired logic state (e.g., a logic "1") to the memory cell, a first pulse having a first polarity and a first magnitude (e.g., voltage 335) may be applied to the memory cell. As described above, the memory cell may include a particular threshold voltage distribution. By applying the first pulse to the memory cell, a snapback event may occur. The snapback event may be characterized by a reduction in the threshold voltage distribution associated with logic state. Stated another way, by applying the first pulse to the memory cell, the threshold voltage distribution associated with logic state may shift (e.g., towards 0V).

The occurrence of the snapback that results from applying the voltage 335 may indicate that a logic "0" as represented by threshold voltage distribution 315 is stored in the memory cell. Rather than applying a programming pulse of a greater magnitude to write a logic "1," the memory controller may reverse the polarity of the programming pulse (e.g., the memory controller may apply a programming pulse having an opposite polarity of a pulse associated with the state stored on the memory cell). Thereby taking advantage of the asymmetrical properties of a programming self-selecting memory cell. Such features may reduce the power consumed during the write operation 355 as compared to the write operation 360.

Because the snapback event results in a reduced voltage distribution of the memory cell, a lower voltage may be used to write a logic state to the memory cell (e.g., relative to write operation 360). Thus, in some examples, a voltage greater than the threshold distribution of the memory cell may be applied to write logic state to the memory cell. Using a lower voltage may ultimately reduce stress on the memory cell and reduce the power consumption of the memory array (e.g., memory array 102 as described with reference to FIG. 1) associated with the memory cell.

Figure 4:
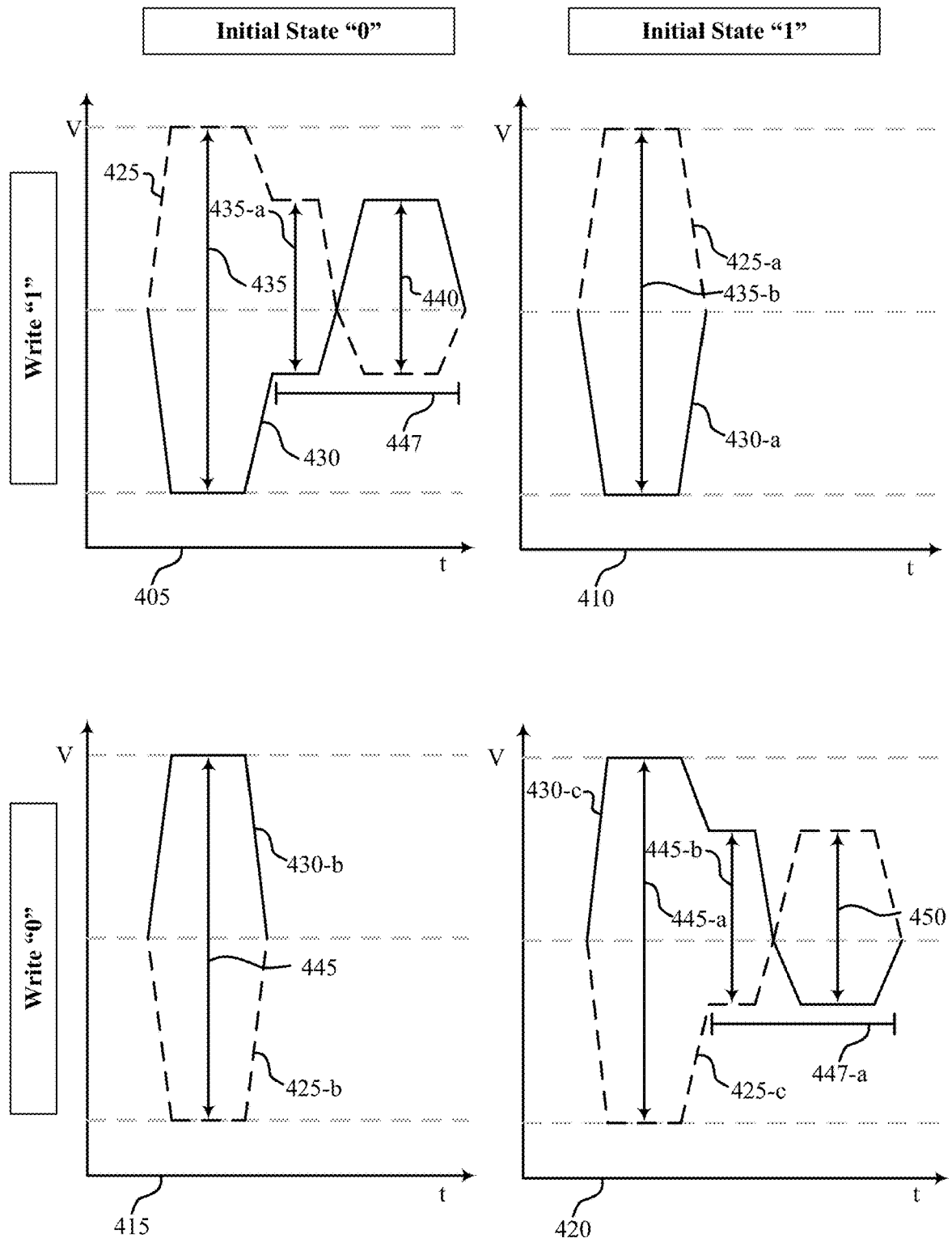
FIG. 4 illustrates examples of a timing diagrams associated with distributions of threshold voltages of a self-selecting memory cell that supports techniques for programming a self-selecting memory device in accordance with aspects of the present disclosure.

FIG. 4 illustrates examples of timing diagrams 400 associated with distributions of threshold voltages of a self-selecting memory cell in accordance with examples of the present disclosure. A self-selecting memory cell may be configured to store a particular logic state based on one or more pulses applied to the cell. The voltage distributions depict logic states that may be stored in a self-selecting memory cell.

Self-selecting memory cells may include a chalcogenide material as described with reference to FIGS. 1 and 2. The threshold voltage distributions may represent various logic states of a memory cell during a write operation. In the example of FIG. 4, the timing diagram 405 may represent writing a second logic state (e.g., a logic "1") to a memory cell that stores a first logic state (e.g., a logic "0"). Timing diagram 410 may represent a write operation where a memory cell stores a same logic state (e.g., a logic "1") as the logic state desired from a write operation (e.g., a logic "1"). Timing diagram 415 may represent a write operation where a memory cell stores a same logic state (e.g., a logic "0") as the logic state desired from a write operation (e.g., a logic "0"). Timing diagram 420 may represent writing a second logic state (e.g., a logic "0") to a memory cell that stores a first logic state (e.g., a logic "1").

Timing diagram 405 may depict a write operation of a memory cell (e.g., of a self-selecting memory cell). Timing diagram 405 may show the voltage 435, which may be referred to as first pulse 435, and voltage 440 (e.g., VHOLD), which may be referred to as second pulse 440. First pulse 435 may be an example of voltage 335 as described with reference to FIG. 3, and second pulse 440 may be an example of voltage 340 as described with reference to FIG. 3, in some cases. Timing diagram 405 may also depict the voltage 425 of an access line (e.g., word line 110 as described with reference to FIG. 1), and the voltage 430 of an access line (e.g., bit line 115 as described with reference to FIG. 1). Accordingly, to conduct a write operation on a memory cell, a first pulse 425 may be applied to one access line and a second pulse 430 may subsequently be applied to a second access line.

A memory cell associated with timing diagram 405 may store a first logic state (e.g., a logic "0"). As described above with reference to FIG. 3, to write a second logic state (e.g., a logic "1") to the memory cell, a first pulse 435 may be applied to the memory cell. The first pulse 435 may be configured such that a snapback event occurs if the memory cell stores a first logic state but that no snapback event occurs if the memory cell stores a second logic state different than the first logic state. Accordingly, first pulse 435 may be applied to the cell with a first polarity.

After applying the first pulse 435, a snapback event may occur which may be characterized by the threshold voltage distribution of the memory cell being reduced. In some examples the snapback event may be determined by a memory controller (e.g., memory controller 140 as described with reference to FIG. 1). The snapback event may cause the threshold voltage associated with the memory cell to be reduced. In some cases, the snapback event may cause the magnitude of the first pulse to be reduced, as shown by the first pulse 435-a.

A snapback event may occur for a fixed duration, and may be followed by a period in which the memory cell is maintained in a higher conductance state (e.g., duration 447). This high conductance state may be referred to as a selection time. Thus, to write a second logic value (e.g., a logic "1") to the memory cell, a second pulse 440 may be applied. In some cases, the second pulse 440 may be similar to the first pulse 435-a, but with a reversed polarity. To reverse the polarity, the voltages applied to the word line and the bit line may be switched. As described with reference to FIG. 3, the second pulse 440 may be applied to the memory cell with a second polarity (e.g., a different polarity). Stated another way, the second pulse 440 may be applied to a respective access line. By applying the second pulse 440 during the selection time (e.g., during duration 447), a second logic state (e.g., a logic "1") may written to the memory cell using a reduced voltage as compared to some write operations. As described above, a lower voltage may ultimately reduce stress on the memory cell and reduce the power consumption of the memory array (e.g., memory array 102 as described with reference to FIG. 1) associated with the memory cell.

In some examples, the second pulse 440 may not be applied during the selection time (e.g., duration 447). Accordingly a threshold voltage of the memory cell may increase to its original level. For example, in the context of timing diagram 405, if second pulse 440 were not applied during duration 447, a threshold voltage of the memory cell may increase to the voltage value depicted prior to duration 447. If the second pulse 440 were to be applied after the duration 447, for example, the magnitude of the pulse may be greater to achieve the same result of writing the logic state to the memory cell. In some examples, the memory cell may be selected after duration 447 by applying a voltage lower than the original threshold voltage of the memory cell. For example, a threshold refresh operation may occur by selecting the memory cell after duration 447 in either polarity without completing the write operation. Because the threshold recovery time of the memory cell may be large (e.g., relative to duration 447) after duration 447, the memory cell may be deselected (e.g., by applying a same voltage to the word line and to the digit line of the memory cell). When deselected, additional snapback events or other array operations may be conducted on other portions of the memory array before completing the write operation depicted by timing diagram 405. This may enable more efficient writes by effectively grouping together multiple cells for some phases of the write operation.

Timing diagram 410 may depict a portion of a write operation of a memory cell (e.g., of a self-selecting memory cell). Timing diagram 410 may show a first pulse 435-b being applied to the memory cell. First pulse 435-a may be an example of voltage 335 as described with reference to FIG. 3. Timing diagram 410 may also depict the voltage 425-a of access line (e.g., word line 110 as described with reference to FIG. 1), and the voltage 430-a of access line (e.g., bit line 115 as described with reference to FIG. 1).

A memory cell associated with timing diagram 410 may store a logic state (e.g., a logic "1"). As described above with reference to FIG. 3, to write a logic state (e.g., a logic "1") to the memory cell, a first pulse 435-*a* may be applied to the memory cell. Accordingly, first pulse 435-*a* may be applied to the cell with a first polarity.

As described above, when a memory cell stores a first logic state (e.g., a logic "0"), a snapback event may occur when writing a second logic state (e.g., a logic "1") to the memory cell. However, when writing (e.g., attempting to write) a same logic state to a memory cell as the memory cell currently stores, a snapback event may not occur. Stated another way, when a memory cell stores a logic "1," and a logic "1" is attempted to be written to the same cell, a snapback event may not occur. Accordingly, as illustrated in timing diagram 410, a snapback event does not occur and the write operation (e.g., the attempted write operation) may be complete. The lack of an occurrence of the snapback event may be detected by not seeing a reduction in the magnitude of the first pulse 435-*b*. If no snapback is detected, the polarity of the programming pulse is not reversed as is shown in timing diagram 405.

Timing diagram 415 may depict a portion of a write operation of a memory cell (e.g., of a self-selecting memory cell). Timing diagram 415 may show a first pulse 445 being applied to the memory cell. First pulse 445 may be an example of voltage 340 as described with reference to FIG. 3. Timing diagram 415 may also depict the voltage 430-*b* of an access line (e.g., word line 110 as described with reference to FIG. 1), and the voltage 425-*b* of a second access line (e.g., bit line 115 as described with reference to FIG. 1).

A memory cell associated with timing diagram 415 may store a logic state (e.g., a logic "0"). As described above with reference to FIG. 3, to write a logic state (e.g., a logic "0") to the memory cell, a first pulse 445 may be applied to the memory cell. Accordingly, first pulse 445 may be applied to the cell with a first polarity. As described above, when a memory cell stores a first logic state (e.g., a logic "1"), a snapback event may occur when writing a second logic state (e.g., a logic "0") to the memory cell.

However, when writing (e.g., attempting to write) a same logic state to a memory cell as the memory cell currently stores, a snapback event may not occur. Stated another way, when a memory cell stores a logic "0," and a logic "0" is attempted to be written to the same cell, a snapback event may not occur. Accordingly, as illustrated in timing diagram 415, a snapback event does not occur and the write operation (e.g., the attempted write operation) may be complete. The lack of an occurrence of the snapback event may be detected by not seeing a reduction in the magnitude of the first pulse 445. If no snapback is detected, the polarity of the programming pulse is not reversed as is shown in timing diagram 405.

Timing diagram 420 may depict a write operation of a memory cell (e.g., of a self-selecting memory cell). Timing diagram 420 may show voltage 445, which may be referred to as first pulse 445, and voltage 450 (e.g., VHOLD), which may be referred to as second pulse 450. First pulse 445 may be an example of voltage 335 as described with reference to FIG. 3, and second pulse 450 may be an example of voltage 340 as described with reference to FIG. 3, in some cases. Timing diagram 420 may also depict the voltage 430-*c* of an access (e.g., word line 110 as described with reference to FIG. 1), and the voltage 425-*c* of a second access line (e.g., bit line 115 as described with reference to FIG. 1). Accordingly, to conduct a write operation on a memory cell, a first pulse 445-*a* may be applied to one access line and a second pulse 450 may subsequently be applied to a second access line.

A memory cell associated with timing diagram 420 may store a first logic state (e.g., a logic "1"). As described above with reference to FIG. 3, to write a second logic state (e.g., a logic "0") to the memory cell, a first pulse 445-*a* may be applied to the memory cell. The first pulse 445-*a* may be configured such that a snapback event occurs if the memory cell stores a first logic state but that no snapback event occurs if the memory cell stores a second logic state different than the first logic state. Accordingly, first pulse 445-*a* may be applied to the cell with a first polarity.

After applying the first pulse, a snapback event may occur which may be characterized by the threshold voltage distribution of the memory cell being reduced. In some examples the snapback event may be determined by a memory controller (e.g., memory controller 140 as described with reference to FIG. 1). The snapback event may cause the threshold voltage associated with the memory cell to be reduced. In some cases, the snapback event may cause the magnitude of the first pulse to be reduced, as shown by the second pulse 450.

A snapback event may occur for a fixed duration, and may be followed by a period in which the memory cell is maintained in a higher conductance state (e.g., duration 447-*a*). This high conductance state may be referred to as a selection time. Thus, to write a second logic value (e.g., a logic "1") to the memory cell, a second pulse 440-*a* may be applied. In some cases, the second pulse 450 may be similar to the first pulse 445-*a*, but with a reversed polarity. To reverse the polarity, the voltages applied to the word line and the bit line may be switched. As described with reference to FIG. 3, the second pulse may be applied to the memory cell with a second polarity (e.g., a different polarity). Stated another way, the second pulse 450 may be applied to the second access line access line. By applying the second pulse 450 during the selection time (e.g., during duration 447-*a*), a second logic state (e.g., a logic "1") may written to the memory cell using a reduced voltage as compared to some write operations. As described above, a lower voltage may ultimately reduce stress on the memory cell and reduce the power consumption of the memory array (e.g., memory array 102 as described with reference to FIG. 1) associated with the memory cell.

In some examples, the second pulse 450 may not be applied during the selection time (e.g., duration 447-*a*). Accordingly a threshold voltage of the memory cell may increase to its original level. For example, in the context of timing diagram 420, if second pulse 450 were not applied during duration 447-*a*, a threshold voltage of the memory cell may increase to the voltage value depicted prior to duration 447-*a*. If the second pulse 450 were to be applied after the duration 447-*a*, for example, the magnitude of the pulse may be greater to achieve the same result of writing the logic state to the memory cell.

Figure 5:
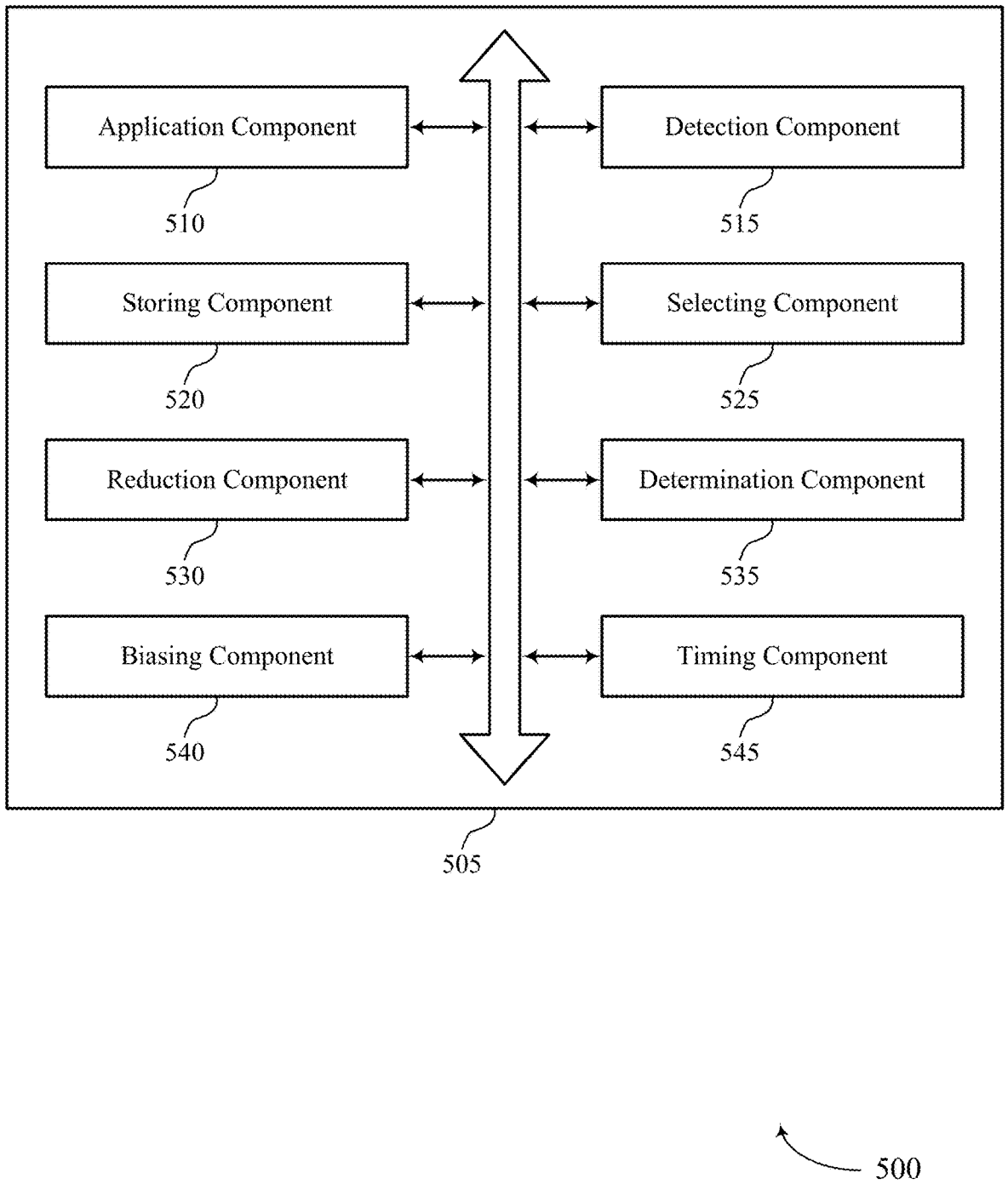
FIG. 5 shows a block diagram of a device that supports techniques for programming a self-selecting memory device in accordance with aspects of the present disclosure.

FIG. 5 shows a block diagram 500 of a snapback event detector 505 that supports techniques for programming a memory cell in accordance with examples of the present disclosure. The snapback event detector 505 may be an example of aspects of a memory controller (e.g., memory controller 140 as described with reference to FIG. 1. The snapback event detector 505 may include application component 510, detection component 515, storing component 520, selecting component 525, reduction component 530, determination component 535, biasing component 540, and timing component 545. Each of these components may communicate, directly or indirectly, with one another (e.g., via one or more buses).

Application component 510 may apply, during a write operation, a first pulse having a first polarity to a memory cell storing a first logic state. In some examples, application component 510 may apply a second pulse having a second polarity different than the first polarity to the memory cell in response to detecting the snapback event. In some examples, application component 510 may apply a first voltage to a first access line coupled with the memory cell. In some examples, application component 510 may apply a second voltage to a second access line coupled with the memory cell, wherein applying the first pulse is based at least in part on applying the first voltage and the second voltage.

In some examples, application component 510 may apply the second voltage to the first access line. In some examples, application component 510 may apply the first voltage to the second access line, wherein applying the second pulse is based at least in part on applying the first voltage to the second access line and the second voltage to the first access line. In some examples, application component 510 may apply the second pulse to the memory cell during the duration when the threshold voltage is reduced. In some examples, application component 510 may apply, during a write operation, a first pulse having a first polarity to a memory cell storing a first logic state. In some examples, application component 510 may apply a first voltage to a first access line coupled with the memory cell. In some examples, application component 510 may apply a second voltage to a second access line coupled with the memory cell, wherein applying the first pulse is based at least in part on applying the first voltage and the second voltage.

In some examples, application component 510 may apply, during the duration, a second pulse to the memory cell during the write operation, the second pulse having a second polarity different than the first polarity. In some examples, application component 510 may apply a first pulse having a voltage across the memory cell in a first direction and a second pulse having a voltage across the memory cell in a second direction. In some examples, application component 510 may apply, during a write operation, a first pulse having a first polarity to the memory cell. In some examples, application component 510 may apply a second pulse having a second polarity different than the first polarity to the memory cell in response to detecting the snapback event.

In some examples, application component 510 may apply the second pulse having the second polarity by applying a voltage to the second access line, the voltage being greater than the reduced threshold voltage. In some examples, application component 510 may apply the first pulse having the first polarity to the memory cell during a duration. In some examples, application component 510 may apply the first pulse having the first polarity by applying a first voltage to the first access line. In some examples, application component 510 may apply the second pulse having the second polarity by applying a second voltage to the second access line, wherein writing the second logic state to the memory cell is based at least in part on a magnitude of the second voltage exceeding a threshold voltage of the memory cell.

Detection component 515 may detect a snapback event at the memory cell in response to applying the first pulse. Detection component 515 may detect a reduction in a magnitude of a voltage across the memory cell, wherein detecting the snapback event is based at least in part on detecting the reduction in the magnitude of the voltage. Detection component 515 may detect the snapback event based at least in part on a value of the first logic state being different than the value of the second logic state to be stored to the memory cell. Detection component 515 may detect a second snapback event at the memory cell in response to applying the second pulse to the memory cell after the duration.

Detection component 515 may detect the first logic state stored by the memory cell in response to applying the first pulse to the memory cell. Detection component 515 may detect the first logic state based at least in part on a threshold voltage of the memory cell being less than a magnitude of the first pulse. Detection component 515 may detect the first logic state during a duration after applying the first pulse, and wherein the second logic state is written to the memory cell during the duration. In some examples, detection component 515 may detect the snapback event at the memory cell during a duration after applying the first pulse. Detection component 515 may detect the first logic state during the duration and the second logic state is written to the memory cell during the duration.

Storing component 520 may store a second logic state different than the first logic state in the memory cell based at least in part on applying the second pulse to the memory cell. In some examples, storing component 520 may store a second logic state in the memory cell by applying a second pulse having a second polarity during the write operation in response to detecting the first logic state, wherein the second logic state is different than the first logic state. Storing component 520 may store the second logic state to the memory cell based at least in part on a threshold voltage of the memory cell being reduced for a duration. In some examples, storing component 520 may store a second logic value in the memory cell after applying the second pulse.

Selecting component 525 may select a voltage magnitude of the first pulse based at least in part on a value of the second logic state to be stored to the memory cell. In some examples, selecting component 525 may select the first pulse from a plurality of pulses based at least in part on a value of the second logic state to be written to the memory cell.

Reduction component 530 may reduce, for a duration, a threshold voltage of a memory cell during a write operation by applying a first pulse to the memory cell having a first polarity, the memory cell comprising a first logic value. In some examples, reduction component 530 may reduce, after the duration, the threshold voltage of the memory cell during the write operation by applying the first pulse to the memory cell having the first polarity, the memory cell comprising the second logic value.

Determination component 535 may determine the first logic value of the memory cell based at least in part on reducing the threshold voltage of the memory cell during the write operation.

Figure 6:
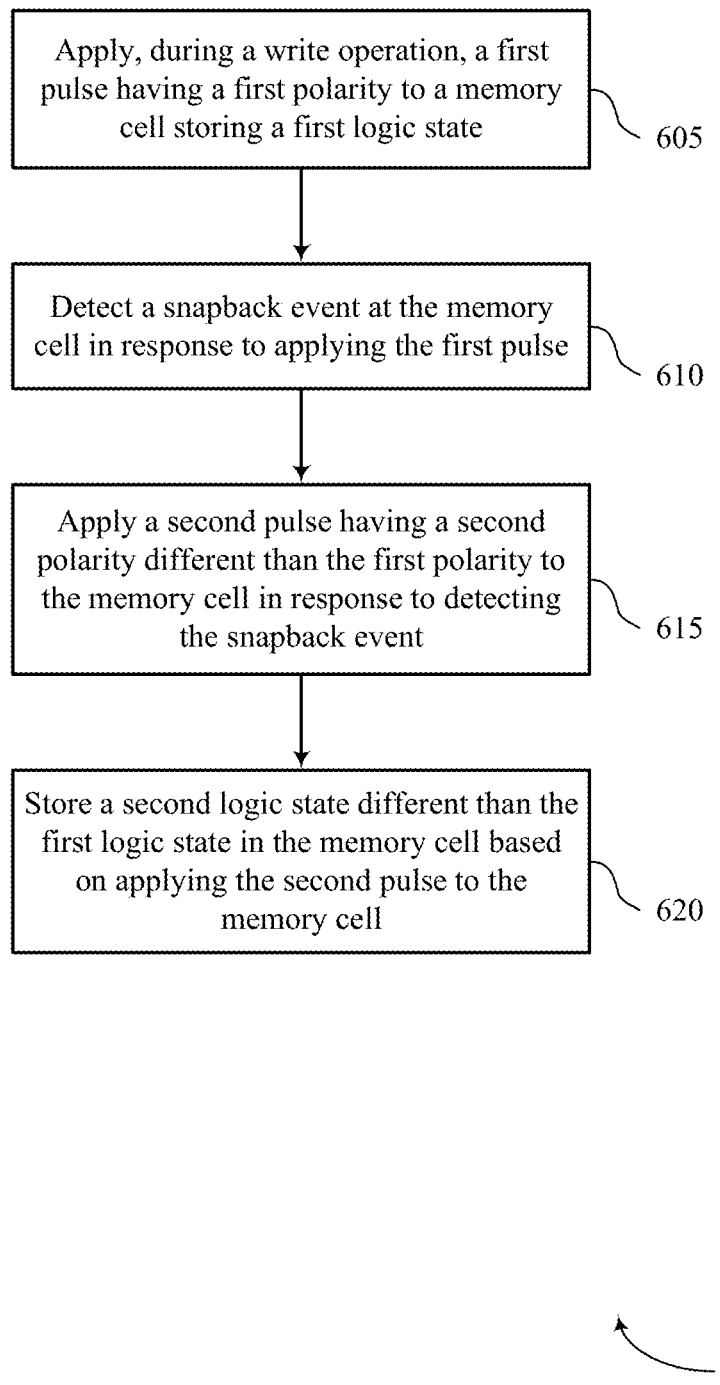
FIGS. 6 through 8 illustrate flowcharts of methods that support techniques for programming a self-selecting memory device in accordance with aspects of the present disclosure.

FIG. 6 shows a flowchart illustrating a method 600 that supports techniques for programming memory cell in accordance with aspects of the present disclosure. The operations of method 600 may be implemented by a memory controller or its components as described herein. For example, the operations of method 600 may be performed by a snapback event detector as described with reference to FIG. 5. In some examples, a memory controller may execute a set of instructions to control the functional elements of the snapback event detector to perform the functions described below. Additionally or alternatively, a memory controller may perform aspects of the functions described below using special-purpose hardware.

At 605, the memory controller may apply, during a write operation, a first pulse having a first polarity to a memory cell storing a first logic state. The operations of 605 may be performed according to the methods described herein. In some examples, aspects of the operations of 605 may be performed by an application component as described with reference to FIG. 5.

At 610, the memory controller may detect a snapback event at the memory cell in response to applying the first pulse. The operations of 610 may be performed according to the methods described herein. In some examples, aspects of the operations of 610 may be performed by a detection component as described with reference to FIG. 5.

At 615, the memory controller may apply a second pulse having a second polarity different than the first polarity to the memory cell in response to detecting the snapback event. The operations of 615 may be performed according to the methods described herein. In some examples, aspects of the operations of 615 may be performed by an application component as described with reference to FIG. 5.

At 620, the memory controller may store a second logic state different than the first logic state in the memory cell based on applying the second pulse to the memory cell. The operations of 620 may be performed according to the methods described herein. In some examples, aspects of the operations of 620 may be performed by a storage component as described with reference to FIG. 5.

Figure 7:
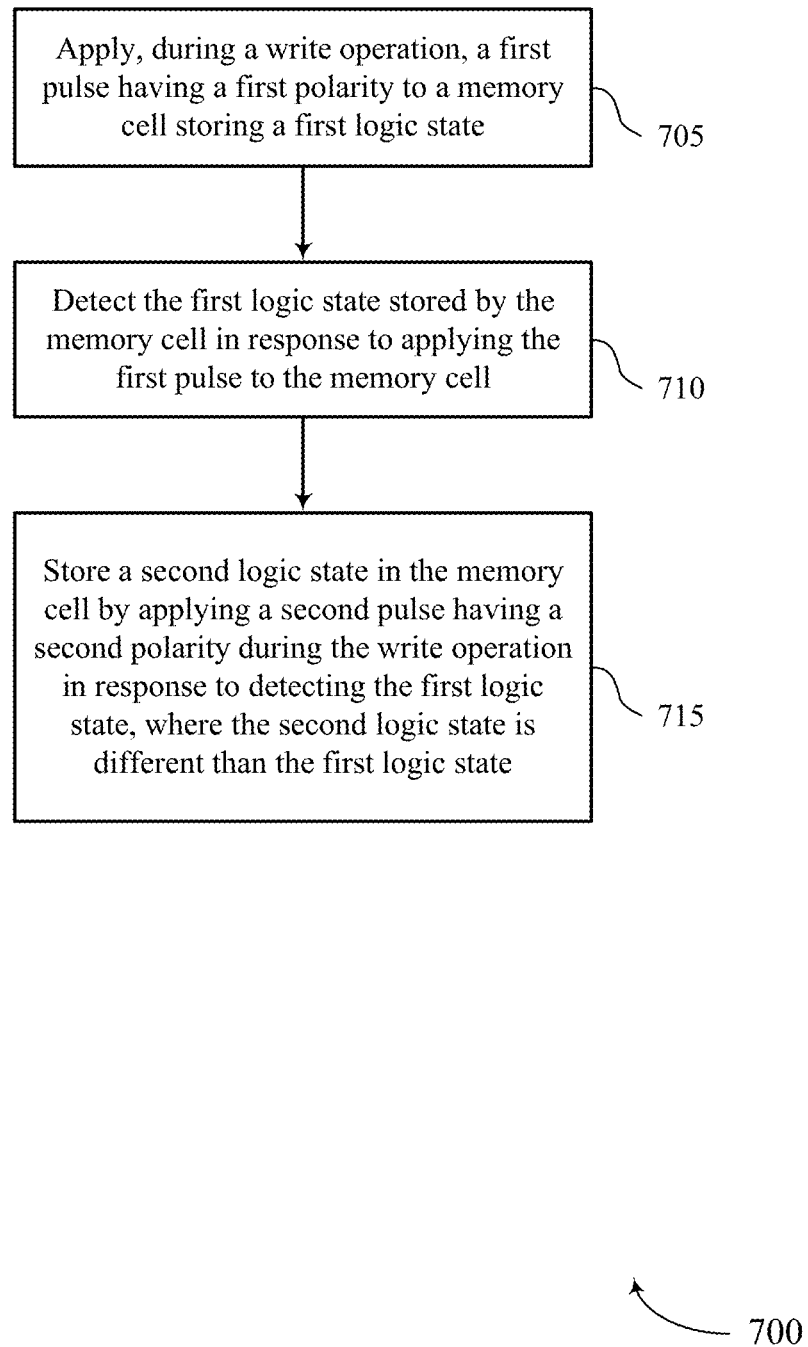

FIG. 7 shows a flowchart illustrating a method 700 that supports techniques for programming memory cell in accordance with aspects of the present disclosure. The operations of method 700 may be implemented by a memory controller or its components as described herein. For example, the operations of method 700 may be performed by a snapback event detector as described with reference to FIG. 5. In some examples, a memory controller may execute a set of instructions to control the functional elements of the snapback event detector to perform the functions described below. Additionally or alternatively, a memory controller may perform aspects of the functions described below using special-purpose hardware.

At 705, the memory controller may apply, during a write operation, a first pulse having a first polarity to a memory cell storing a first logic state. The operations of 705 may be performed according to the methods described herein. In some examples, aspects of the operations of 705 may be performed by an application component as described with reference to FIG. 5.

At 710, the memory controller may detect the first logic state stored by the memory cell in response to applying the first pulse to the memory cell. The operations of 710 may be performed according to the methods described herein. In some examples, aspects of the operations of 710 may be performed by a detection component as described with reference to FIG. 5.

At 715, the memory controller may store a second logic state in the memory cell by applying a second pulse having a second polarity during the write operation in response to detecting the first logic state, where the second logic state is different than the first logic state. The operations of 715 may be performed according to the methods described herein. In some examples, aspects of the operations of 715 may be performed by a storage component as described with reference to FIG. 5.

Figure 8:
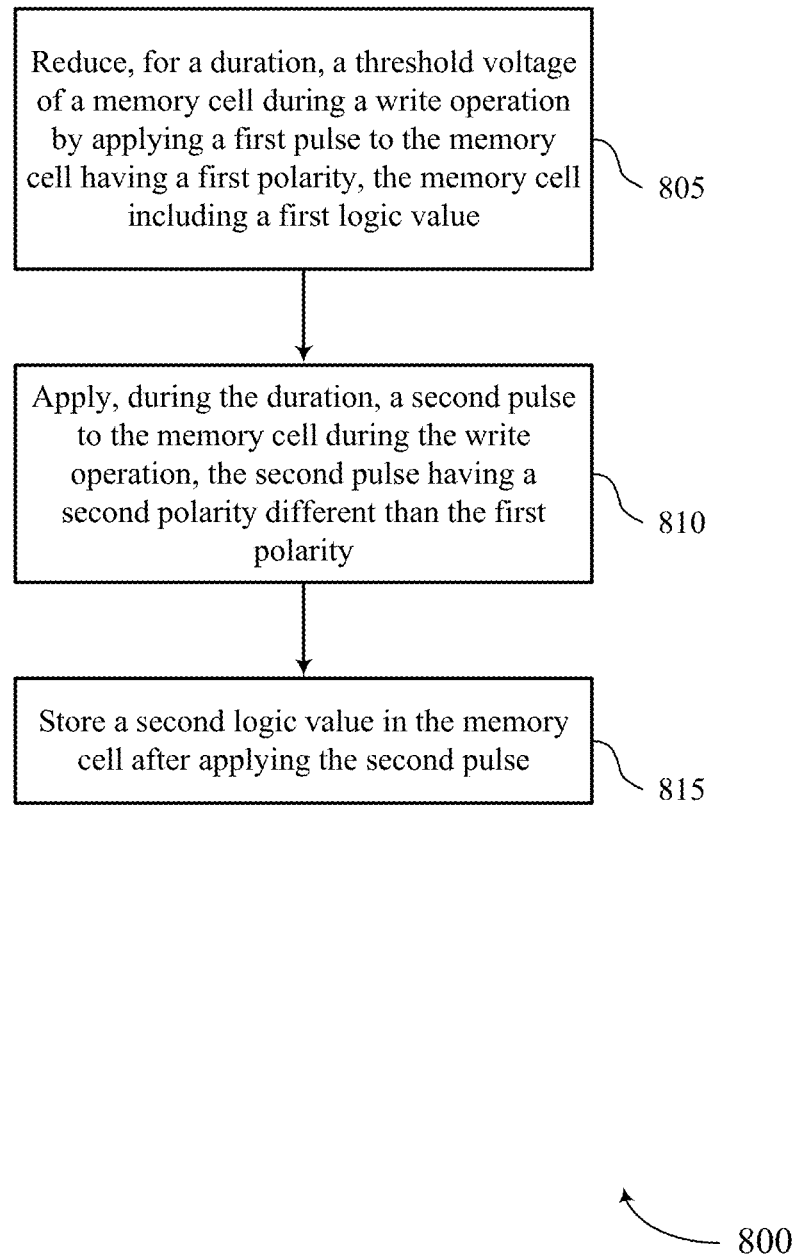

FIG. 8 shows a flowchart illustrating a method 800 that supports techniques for programming memory cell in accordance with aspects of the present disclosure. The operations of method 800 may be implemented by a memory controller or its components as described herein. For example, the operations of method 800 may be performed by a snapback event detector as described with reference to FIG. 5. In some examples, a memory controller may execute a set of instructions to control the functional elements of the snapback event detector to perform the functions described below. Additionally or alternatively, a memory controller may perform aspects of the functions described below using special-purpose hardware.

At 805, the memory controller may reduce, for a duration, a threshold voltage of a memory cell during a write operation by applying a first pulse to the memory cell having a first polarity, the memory cell including a first logic value. The operations of 805 may be performed according to the methods described herein. In some examples, aspects of the operations of 805 may be performed by a reduction component as described with reference to FIG. 5.

At 810, the memory controller may apply, during the duration, a second pulse to the memory cell during the write operation, the second pulse having a second polarity different than the first polarity. The operations of 810 may be performed according to the methods described herein. In some examples, aspects of the operations of 810 may be performed by an application component as described with reference to FIG. 5.

At 815, the memory controller may store a second logic value in the memory cell after applying the second pulse. The operations of 815 may be performed according to the methods described herein. In some examples, aspects of the operations of 815 may be performed by a storage component as described with reference to FIG. 5.

A method is described. In some examples, the method may include applying, during a write operation, a first pulse having a first polarity to a memory cell storing a first logic state. In some examples, the method may include detecting a snapback event at the memory cell in response to applying the first pulse. The method may include applying a second pulse having a second polarity different than the first polarity to the memory cell in response to detecting the snapback event. The method may include storing a second logic state different than the first logic state in the memory cell based at least in part on applying the second pulse to the memory cell. In some examples, the method may include applying a first voltage to a first access line coupled with the memory cell. The method may include applying a second voltage to a second access line coupled with the memory cell, wherein applying the first pulse is based at least in part on applying the first voltage and the second voltage.

The method may include applying the second voltage to the first access line. The method may include applying the first voltage to the second access line, wherein applying the second pulse is based at least in part on applying the first voltage to the second access line and the second voltage to the first access line. In some examples, the method may include detecting a reduction in a magnitude of a voltage across the memory cell, wherein detecting the snapback event is based at least in part on detecting the reduction in the magnitude of the voltage. In some examples, the snapback event is based at least in part on a value of the first logic state being different than the value of the second logic state to be stored to the memory cell. In some examples, the method may include selecting a voltage magnitude of the first pulse based at least in part on a value of the second logic state to be stored to the memory cell.

In some examples, a threshold voltage of the memory cell is reduced based at least in part on applying the first pulse. In some examples, the reduced threshold voltage of the memory cell is based at least in part on the first logic state. In some examples, a magnitude of the threshold voltage of the memory cell is reduced for a duration in response to the occurrence of the snapback event. In some examples, the second pulse is applied to the memory cell during the duration when the threshold voltage is reduced. In some examples, the method may include performing, during the duration, a read operation or an additional write operation on the memory cell. In some examples, the second pulse may be applied after the duration. In some examples, operations other than a write operation may occur between the first pulse and the second pulse. In some examples, the method may include detecting a second snapback event at the memory cell in response to applying the second pulse to the memory cell after the duration. In some examples, the reduced threshold voltage of the memory cell is based at least in part on the first logic state. In some examples, the memory cell comprises a self-selecting memory cell.

In some examples, a threshold refresh operation may occur by selecting the memory cell after the duration in either polarity without completing the write operation. In some examples, when the memory cell is deselected, additional snapback events or other array operations may be conducted on other portions of the memory array before completing the write operation.

An apparatus is described. In some examples, the apparatus may support means for applying, during a write operation, a first pulse having a first polarity to a memory cell storing a first logic state. The apparatus may support means for detecting a snapback event at the memory cell in response to applying the first pulse. The apparatus may support means for applying a second pulse having a second polarity different than the first polarity to the memory cell in response to detecting the snapback event. The apparatus may support means for storing a second logic state different than the first logic state in the memory cell based at least in part on applying the second pulse to the memory cell. The apparatus may support means for applying a first voltage to a first access line coupled with the memory cell. The apparatus may support means for applying a second voltage to a second access line coupled with the memory cell, wherein applying the first pulse is based at least in part on applying the first voltage and the second voltage.

The apparatus may support means for applying the second voltage to the first access line. The apparatus may support means for applying the first voltage to the second access line, wherein applying the second pulse is based at least in part on applying the first voltage to the second access line and the second voltage to the first access line. The apparatus may support means for detecting a reduction in a magnitude of a voltage across the memory cell, wherein detecting the snapback event is based at least in part on detecting the reduction in the magnitude of the voltage. The apparatus may support means for selecting a voltage magnitude of the first pulse based at least in part on a value of the second logic state to be stored to the memory cell. The apparatus may support means for detecting a second snapback event at the memory cell in response to applying the second pulse to the memory cell after the duration.

A method is described. In some examples, the method may include applying, during a write operation, a first pulse having a first polarity to a memory cell storing a first logic state. The method may include detecting the first logic state stored by the memory cell in response to applying the first pulse to the memory cell. The method may include storing a second logic state in the memory cell by applying a second pulse having a second polarity during the write operation in response to detecting the first logic state, wherein the second logic state is different than the first logic state. The method may include applying a first voltage to a first access line coupled with the memory cell. The method may include applying a second voltage to a second access line coupled with the memory cell, wherein applying the first pulse is based at least in part on applying the first voltage and the second voltage.

In some examples, a threshold refresh operation may occur by selecting the memory cell after the duration in either polarity without completing the write operation. In some examples, when the memory cell is deselected, additional snapback events or other array operations may be conducted on other portions of the memory array before completing the write operation.

In some examples, applying the first voltage to the first access line reduces a threshold voltage of the memory cell. In some examples, the second voltage is greater than the reduced threshold voltage of the memory cell. In some examples, detecting the first logic state is based at least in part on a threshold voltage of the memory cell being less than a magnitude of the first pulse. In some examples, storing the second logic state to the memory cell is based at least in part on a threshold voltage of the memory cell being reduced for a duration. In some examples, the first polarity is opposite of the second polarity. In some examples, the first logic state is detected during a duration after applying the first pulse, and wherein the second logic state is written to the memory cell during the duration. In some cases, operations other than a write operation may be performed during the duration and/or before the second logic state is written to the memory cell.

An apparatus is described. In some examples, the apparatus may support means for applying, during a write operation, a first pulse having a first polarity to a memory cell storing a first logic state. The apparatus may support means for detecting the first logic state stored by the memory cell in response to applying the first pulse to the memory cell. The apparatus may support means for storing a second logic state in the memory cell by applying a second pulse having a second polarity during the write operation in response to detecting the first logic state, wherein the second logic state is different than the first logic state. The apparatus may support means for applying a first voltage to a first access line coupled with the memory cell. The apparatus may support means for applying a second voltage to a second access line coupled with the memory cell, wherein applying the first pulse is based at least in part on applying the first voltage and the second voltage.

A method is described. In some examples, the method may include reducing, for a duration, a threshold voltage of a memory cell during a write operation by applying a first pulse to the memory cell having a first polarity, the memory cell comprising a first logic value. The method may include applying, during the duration, a second pulse to the memory cell during the write operation, the second pulse having a second polarity different than the first polarity. The method may include storing a second logic value in the memory cell after applying the second pulse. The method may include determining the first logic value of the memory cell based at least in part on reducing the threshold voltage of the memory cell during the write operation. In some cases, the first logic value of the memory may be determined before the write operation is complete.

The method may include reducing, after the duration, the threshold voltage of the memory cell during the write operation by applying the first pulse to the memory cell having the first polarity, the memory cell comprising the second logic value. In some examples, a magnitude of the second pulse applied to the memory cell is less than a magnitude of the first pulse. In some examples, the first pulse applies a voltage across the memory cell in a first direction and the second pulse applies a voltage across the memory cell in a second direction.

An apparatus is described. In some examples, the apparatus may support means for reducing, for a duration, a threshold voltage of a memory cell during a write operation by applying a first pulse to the memory cell having a first polarity, the memory cell comprising a first logic value. The apparatus may support means for applying, during the duration, a second pulse to the memory cell during the write operation, the second pulse having a second polarity different than the first polarity. The apparatus may support means for storing a second logic value in the memory cell after applying the second pulse. The apparatus may support means for determining the first logic value of the memory cell based at least in part on reducing the threshold voltage of the memory cell during the write operation. The apparatus may support means for reducing, after the duration, the threshold voltage of the memory cell during the write operation by applying the first pulse to the memory cell having the first polarity, the memory cell comprising the second logic value.

It should be noted that the methods described above describe possible implementations, and that the operations and the steps may be rearranged or otherwise modified and that other implementations are possible. Further, aspects from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

As used herein, the term "substantially" means that the modified characteristic (e.g., a verb or adjective modified by the term substantially) need not be absolute but is close enough so as to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array 102.

The devices discussed herein, including memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
    applying, during a write operation, a first pulse having a first polarity to a memory cell storing a first logic state;
    detecting a snapback event at the memory cell in response to applying the first pulse;
    applying a second pulse having a second polarity different than the first polarity to the memory cell in response to detecting the snapback event; and
    storing a second logic state different than the first logic state in the memory cell based at least in part on applying the second pulse to the memory cell.

2. The method of claim 1, further comprising:
    applying a first voltage to a first access line coupled with the memory cell; and
    applying a second voltage to a second access line coupled with the memory cell, wherein applying the first pulse is based at least in part on applying the first voltage and the second voltage.

3. The method of claim 2, further comprising:
    applying the second voltage to the first access line; and
    applying the first voltage to the second access line, wherein applying the second pulse is based at least in part on applying the first voltage to the second access line and the second voltage to the first access line.

4. The method of claim 1, further comprising:
    detecting a reduction in a magnitude of a voltage across the memory cell, wherein detecting the snapback event is based at least in part on detecting the reduction in the magnitude of the voltage.

5. The method of claim 1, wherein the snapback event is based at least in part on a value of the first logic state being different than the value of the second logic state to be stored to the memory cell.

6. The method of claim 1, further comprising:
    selecting a voltage magnitude of the first pulse based at least in part on a value of the second logic state to be stored to the memory cell.

7. The method of claim 1, wherein a threshold voltage of the memory cell is reduced based at least in part on applying the first pulse.

8. The method of claim 7, wherein the reduced threshold voltage of the memory cell is based at least in part on the first logic state.

9. The method of claim 7, wherein a magnitude of the threshold voltage of the memory cell is reduced for a duration in response to the occurrence of the snapback event.

10. The method of claim 9, wherein the second pulse is applied to the memory cell during the duration when the threshold voltage is reduced.

11. The method of claim 9, further comprising:
    performing, during the duration, a read operation or other operation, wherein the second pulse is applied after the duration.

12. The method of claim 9, further comprising:
    detecting a second snapback event at the memory cell in response to applying the second pulse to the memory cell after the duration.

13. The method of claim 9, wherein the reduced threshold voltage of the memory cell is based at least in part on the first logic state.

14. The method of claim 1, wherein the memory cell comprises a self-selecting memory cell.

15. An apparatus, comprising:
    a first access line coupled with a memory cell storing a first logic state;
    a second access line coupled with the memory cell; and
    a memory controller coupled with the first access line and the second access line, the memory controller configured to:
        apply, during a write operation, a first pulse having a first polarity to the memory cell;

detect a snapback event at the memory cell in response to applying the first pulse;

apply a second pulse having a second polarity different than the first polarity to the memory cell in response to detecting the snapback event; and store a second logic state different than the first logic state in the memory cell based at least in part on applying the second pulse to the memory cell.

16. The apparatus of claim 15, wherein the memory controller is configured to detect the snapback event at the memory cell during a duration after applying the first pulse.

17. The apparatus of claim 16, wherein the memory cell comprises a reduced threshold voltage during the duration.

18. The apparatus of claim 17, wherein applying the second pulse having the second polarity comprises applying a voltage to the second access line, the voltage being greater than the reduced threshold voltage.

* * * * *